(12) United States Patent
Oh

(10) Patent No.: US 7,701,132 B2
(45) Date of Patent: Apr. 20, 2010

(54) ORGANIC ELECTROLUMINESCENCE DISPLAY DEVICE HAVING AUXILIARY ELECTRODE LINE AND METHOD OF MANUFACTURING THE SAME

(75) Inventor: Sang-Hun Oh, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 133 days.

(21) Appl. No.: 11/288,571

(22) Filed: Nov. 29, 2005

(65) Prior Publication Data

US 2006/0113900 A1 Jun. 1, 2006

(30) Foreign Application Priority Data

Nov. 29, 2004 (KR) ...................... 10-2004-0098878

(51) Int. Cl.
H01J 1/62 (2006.01)
H01J 63/04 (2006.01)
H05B 33/06 (2006.01)

(52) U.S. Cl. ........................ 313/504; 313/498; 313/509; 313/506; 257/72; 257/88; 257/89; 257/91; 445/24

(58) Field of Classification Search ......... 313/498–512; 445/24–25; 315/169.1, 169.3; 348/690–691, 348/917; 257/40, 72, 79–103, 642–643, 257/759

See application file for complete search history.

(56) References Cited

U.S. PATENT DOCUMENTS

| 7,045,861 B2 * | 5/2006 | Takayama et al. ........... 257/347 |
| 7,148,502 B2 * | 12/2006 | Yamazaki et al. ............. 257/40 |
| 7,189,996 B2 * | 3/2007 | Nakamura .................... 257/59 |
| 7,221,095 B2 * | 5/2007 | Yamazaki et al. ........... 313/509 |
| 7,224,118 B2 * | 5/2007 | Yamazaki et al. ........... 313/506 |
| 7,230,271 B2 * | 6/2007 | Yamazaki et al. ............. 257/72 |
| 7,230,593 B2 * | 6/2007 | Nakanishi ..................... 345/80 |

(Continued)

FOREIGN PATENT DOCUMENTS

CN 1416302 5/2003

(Continued)

OTHER PUBLICATIONS

Office Action issued on Sep. 28, 2007 in the corresponding Chinese Patent Application No. 20051003499.2.

(Continued)

*Primary Examiner*—Sikha Roy
*Assistant Examiner*—Jose M Diaz
(74) *Attorney, Agent, or Firm*—Knobbe Martens Olson & Bear LLP

(57) ABSTRACT

An organic electroluminescence display device and a method of manufacturing the same, configured to prevent IR drop of a second electrode by forming an auxiliary electrode line in an organic electroluminescence display device, are disclosed. The display device is also configured to prevent pixel shrinkage caused by deterioration of an organic electroluminescent layer due to transfer of gases into the organic electroluminescent layer. The out-gassing is prevented by providing a plurality of patterns and/or trenches in the auxiliary electrode line to reduce the contact area between the auxiliary electrode line and the second electrode, thereby lowering heat resistance and optimizing heat transfer during a curing process, and also allowing for removal of remaining gases in an organic film.

31 Claims, 7 Drawing Sheets

U.S. PATENT DOCUMENTS

| | | | |
|---|---|---|---|
| 2003/0193056 A1* | 10/2003 | Takayama et al. | 257/79 |
| 2003/0201716 A1* | 10/2003 | Yamazaki et al. | 313/506 |
| 2004/0100191 A1* | 5/2004 | Park | 313/506 |
| 2004/0135151 A1* | 7/2004 | Okamoto et al. | 257/72 |
| 2004/0256980 A1* | 12/2004 | Tsuchiya | 313/503 |
| 2005/0012454 A1* | 1/2005 | Yamazaki et al. | 313/506 |
| 2005/0073247 A1* | 4/2005 | Yamazaki et al. | 313/503 |
| 2006/0019573 A1* | 1/2006 | Koo et al. | 445/24 |

FOREIGN PATENT DOCUMENTS

| | | |
|---|---|---|
| CN | 1450841 | 10/2003 |
| CN | 1503602 | 6/2004 |
| EP | 1109225 | 6/2001 |
| JP | 2000-299183 | 10/2000 |
| JP | 2000-357584 | 12/2000 |
| JP | 2004-062164 | 2/2004 |
| JP | 2004-214010 | 7/2004 |

OTHER PUBLICATIONS

Japanese Office Action dated Jun. 23, 2009 for corresponding Japanese Application No. 2005-330564.

Korean Patent Registration Gazette No. 10-0700643 dated Mar. 21, 2007 corresponding to Korean Patent Application No. 10-2004-0098878.

Chinese Patent Registration Gazette dated Jan. 6, 2010 which corresponds to Chinese Patent Application No. 200510003499.2.

* cited by examiner

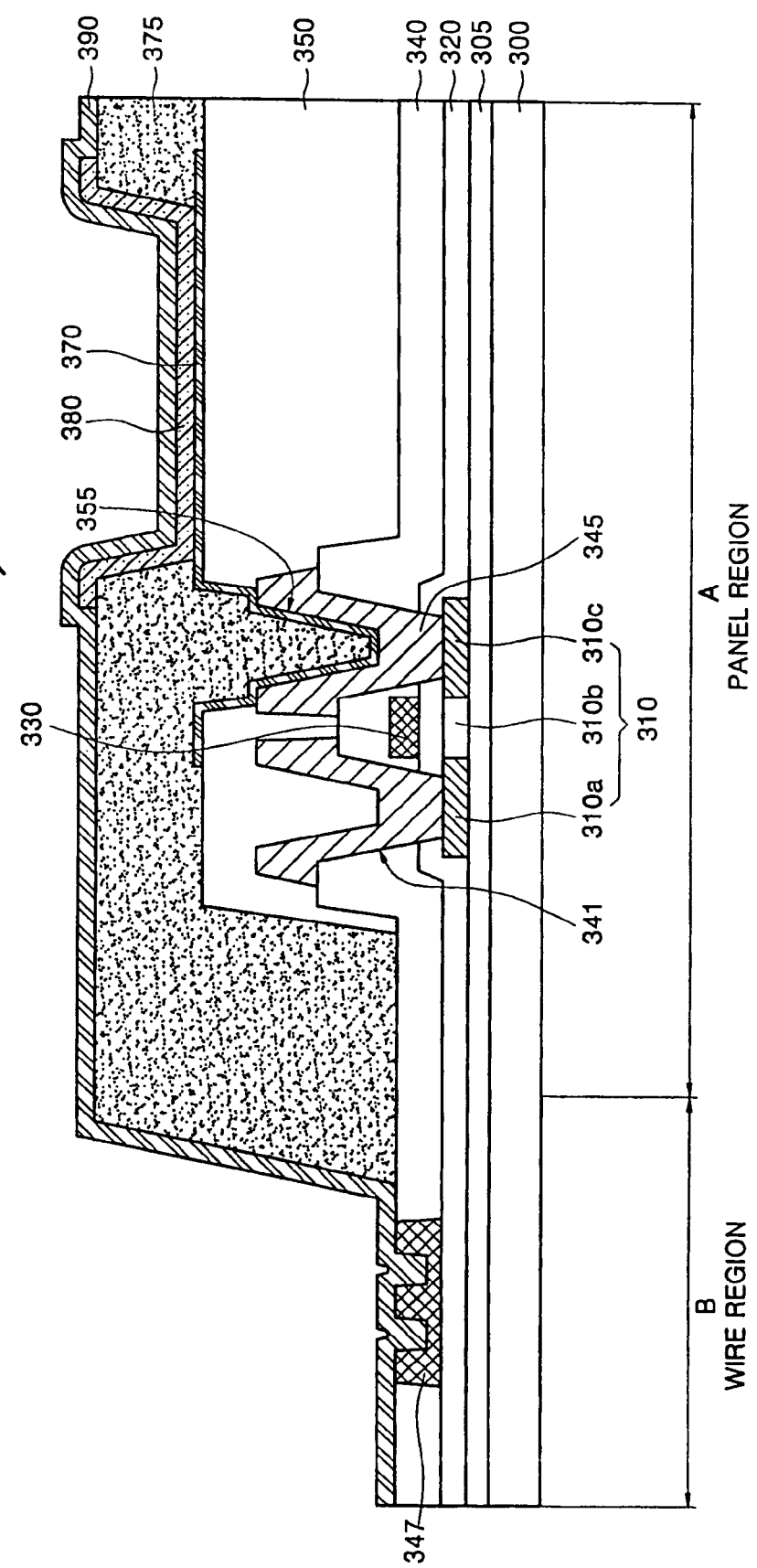

ORGANIC ELECTROLUMINESCENCE DISPLAY DEVICE HAVING AUXILIARY ELECTRODE LINE AND METHOD OF MANUFACTURING THE SAME

BACKGROUND OF THE INVENTION

This application claims the priority of Korean Patent Application No. 10-2004-98878, filed on Nov. 29, 2004, in the Korean Intellectual Property Office, the disclosure of which is incorporated herein in its entirety by reference.

1. Field of the Invention

The present invention relates generally to organic electroluminescence display devices and methods of manufacturing the same, and more particularly to an organic electroluminescence display device configured to prevent a pixel shrinkage phenomenon caused by deterioration of an organic electroluminescent layer.

2. Description of the Related Technology

An organic electroluminescence display device, such as an organic light emitting diode (OLED) display, has desirable characteristics such as spontaneous emission, wide viewing angle, fast response, small thickness, low production cost, and high contrast. Therefore, much attention has been paid to the organic electroluminescence display device as a next generation flat display device.

An exemplary organic electroluminescence display device comprises an anode electrode, a cathode electrode, and an organic electroluminescent layer interposed therebetween. Electrons and holes supplied from the respective anode and cathode electrodes are combined into electron-hole pairs in an excited state thereof, wherein these excited electron-hole pairs can be referred to as excitons. When the excitons return to a ground state, the energy difference between the excited and ground states is emitted as visible light.

Organic electroluminescence display devices are classified into a passive matrix type and an active matrix type, according to their pixel driving schemes, and the devices are arrayed in an N×M matrix. In a passive matrix type organic electroluminescence display device, the anode and cathode electrodes are arranged perpendicular to each other, and the pixels are driven by line selection. In the active matrix type organic electroluminescence display device, a pixel electrode of each pixel, that is, a display region, is connected to a thin film transistor, and the voltage of the pixel is maintained by capacitance of a capacitor connected to the thin film transistor.

More specifically, in the active matrix type organic electroluminescence display device, each unit pixel includes a switching transistor, a driving transistor, a capacitor, and an electroluminescence (EL) element, such as a light emitting diode. A voltage supply line Vdd is provided as a common power source to the driving transistor and the capacitor. The voltage supply line Vdd controls the current through the driving transistor to the EL element. In addition, an auxiliary electrode line is provided as an auxiliary power source to a second electrode. The auxiliary electrode line provides a current by generating a potential difference between source/drain electrodes and the second electrode.

FIG. 1 is a cross sectional view of an exemplary active matrix type organic electroluminescence display device. Referring to FIG. 1, the conventional active matrix type organic electroluminescence display device 10 comprises a substrate 100 having panel and wire regions A and B, and a buffer layer 105. A semiconductor layer 110, comprising source/drain regions 110$c$ and 110$a$ and a channel region 110$b$, is disposed on the buffer layer 105 in the panel region A. In one embodiment, the source/drain regions 110$c$ and 110$a$ and the channel region 110$b$ are formed by a patterning process.

The display device 10 further comprises a gate insulating layer 120 disposed over the semiconductor layer 110, and a gate electrode 130 corresponding to the channel region 110$b$ formed on the gate insulating layer 120 in the panel region A. An interlayer insulating layer 140 is formed on the gate electrode 130 over substantially the entire surface of the substrate 100. Following formation of the interlayer insulating layer 140, source/drain electrodes 145 are connected to the source/drain regions 110$c$ and 110$a$ through contact holes 141 formed in the interlayer insulating layer 140 in the panel region A. The semiconductor layer 110, the gate electrode 130, and the source/drain electrodes 145 form a thin film transistor (TFT).

A first conductive pattern 147, comprising substantially the same material as that of the source/drain electrodes 145, is also formed in the wire region B. The first conductive pattern 147 forms the aforementioned auxiliary electrode line. Subsequently, an insulating layer 150, such as a passivation layer and a planarization layer, is formed on the source/drain electrodes 145 and the first conductive pattern 147, and over substantially the entire surface of the substrate 100. Next, the insulating layer 150 formed on the upper portion of the first conductive pattern 147 in the wire region B is removed by a lithography process, for example.

A via hole 155 is formed on the insulating layer 150 in the panel region A to expose one of the source/drain electrodes 145. A first electrode 170 is formed by a patterning process so as to contact the source/drain electrodes 145 through the via hole 155, and extend to the insulating layer 150.

Following formation of the first electrode 170, to the exclusion of the wire region B, a pixel defining layer 175 having an opening 178 is formed on the first electrode 170 and the insulating layer 150. Next, an organic layer 180, including at least an organic electroluminescent layer, is formed on the first electrode 170 exposed by the opening in the panel region A. The organic layer 180 may be formed, for example by a patterning process. A second electrode 190 is formed on the organic layer 180 over substantially the entire surface of the substrate 100. Thereby, the second electrode 190 in the wire region B is electrically connected to the first conductive pattern 147.

In some organic electroluminescence display devices, the first conductive pattern 147 comprises the same material as that of the source/drain electrodes 145 in the panel region A, and a line width of the first conductive pattern 147 may be large. The materials of the first conductive pattern 147, molybdenum (Mo), tungsten (W), and molybdenum tungsten (MoW), have a higher heat capacity than a silicon nitride (SiNx) layer of the insulating layer 150. The "heat capacity" of a substance is the amount of heat energy required to change its temperature by one degree, and has units of energy per degree. Because of the differences in heat capacity between the first conductive pattern 147 and the silicon nitride layer, the first conductive pattern 147 cannot effectively transfer heat to the silicon nitride layer. As a result, reflow is not effectively performed between each of the panel regions during the organic layer curing process. Thereby, the effects of the curing process are different between the panel regions of a display, causing the thicknesses of the organic layers to be different between the panel regions of the display. In addition, gases remaining in the organic layers may cause pixel shrinkage. Specifically, the out-gassing or gases remaining in an organic layer may result in deterioration of the organic electroluminescent layer of the display.

Furthermore, a small line width of the first conductive pattern 147 may cause IR drop at the second electrode. IR drop is a signal integrity effect caused by wire resistance and current drawn from power and ground grids. If wire resistance is too high or the cell current larger than predicted, an unacceptable voltage drop may occur. This results in poor performance and increased noise susceptibility.

SUMMARY OF CERTAIN INVENTIVE EMBODIMENTS

In order to solve the aforementioned problems, embodiments of the invention include an organic electroluminescence display device and a method of manufacturing the same, wherein IR drop of a second electrode is prevented by forming an auxiliary electrode line in the organic electroluminescence display device. The auxiliary electrode line comprises a plurality of patterns and/or trenches which reduce a contact area between the auxiliary electrode line and the second electrode. This reduction in contact area reduces heat resistance, thereby improving heat transfer during the curing of an organic layer in the display device. The improved heat transfer results in a more uniform organic layer, which provides for removal of gases remaining in the organic layer, thereby preventing deterioration of an organic electroluminescent layer due to out-gassing of the remaining gases into the organic electroluminescent layer. Thus, pixel shrinkage due to deterioration of the organic electroluminescent layer is prevented.

According to a first aspect of the invention, an organic electroluminescence display device comprises a substrate having a panel region and a wire region, and a thin film transistor formed in the panel region of the substrate, wherein the thin film transistor comprises a semiconductor layer, a gate electrode, and source/drain electrodes. The display device further comprises a plurality of first conductive patterns formed in the wire region of the substrate, an insulating layer formed on the first conductive patterns to expose at least the first conductive patterns, and a first electrode formed in contact with one of the source/drain electrodes through a via hole formed in the insulating layer. The display device also comprises a plurality of second conductive patterns formed on the first conductive patterns in the wire region, an organic layer formed on the first electrode in the panel region using a patterning process, wherein the organic layer comprises at least one organic electroluminescent layer, and a second electrode formed on the organic layer over the entire surface of the substrate.

In some embodiments, the first and second conductive patterns are electrically connected to the second electrode to constitute an auxiliary electrode line. In addition, the first conductive patterns may comprise the same material as that of the source/drain electrodes, and the second conductive patterns may comprise the same material as that of the first electrode.

According to a second aspect of the invention, an organic electroluminescence display device comprises a substrate having a panel region and a wire region, and a thin film transistor formed in the panel region of the substrate, wherein the thin film transistor comprises a semiconductor layer, a gate electrode, and source/drain electrodes. The display device further comprises a first conductive pattern formed in the wire region of the substrate and having a trench, an insulating layer formed on the first conductive pattern to expose at least the first conductive pattern, and a first electrode formed to be in contact with one of the source/drain electrodes through a via hole formed in the insulating layer. The display device also comprises an organic layer formed on the first electrode in the panel region using a patterning process, wherein the organic layer comprises at least an organic electroluminescent layer, and a second electrode formed on the organic layer over substantially the entire surface of the substrate. In this second aspect, the first conductive pattern may be electrically connected to the second electrode so as to form an auxiliary electrode line. In addition, the first conductive pattern may have a trench comprising the same material as those of the source/drain electrodes.

According to a third aspect of the invention, an organic electroluminescence display device comprises a substrate having a panel region and a wire region, and a thin film transistor formed in the panel region of the substrate, wherein the thin film transistor comprises a semiconductor layer, a gate electrode, and source/drain electrodes. The display device further comprises a plurality of first conductive patterns formed in the wire region of the substrate, an insulating layer formed to expose at least upper portions of the first conductive patterns, a first electrode formed in contact with one of the source/drain electrodes through a via hole in the insulating layer, and a plurality of second conductive patterns formed in contact with the first conductive patterns in the insulating layer of the wire region. The display device also comprises an organic layer formed on the first electrode in the panel region using a patterning process, wherein the organic layer comprises at least a first organic electroluminescent layer, and a second electrode formed on the organic layer over the entire surface of the substrate. In this third aspect, the first and second conductive patterns may be electrically connected to the second electrode so as to form an auxiliary electrode line. In addition, the first conductive patterns may comprise the same material as that of the gate electrode, and the second conductive patterns may comprise the same material as that of the first electrode.

According to a fourth aspect of the invention, an organic electroluminescence display device comprises a substrate having a panel region and a wire region, and a thin film transistor formed in the panel region of the substrate, wherein the thin film transistor comprises a semiconductor layer, a gate electrode, and source/drain electrodes. The display device further comprises a first conductive pattern formed in the wire region of the substrate and having a trench, an interlayer insulating layer formed on the first conductive pattern to expose at least an upper portion of the first conductive pattern, and an insulating layer, wherein the insulating layer is formed on the source/drain electrodes and removed on the upper portion of the first conductive pattern using a lithography process. The display device also comprises a first electrode formed in contact with one of the source/drain electrodes through a via hole formed in the insulating layer, an organic layer formed on the first electrode using a patterning process, the organic layer comprising at least one organic electroluminescent layer, and a second electrode formed on the organic layer over substantially the entire surface of the substrate. In this fourth aspect, the first conductive pattern may be electrically connected to the second electrode so as to form an auxiliary electrode line. In addition, the first conductive pattern may have a trench comprising the same material as that of the gate electrode.

BRIEF DESCRIPTION OF THE DRAWINGS

The above and other features and advantages of the present invention will become more apparent by describing in detail exemplary embodiments thereof with reference to the attached drawings in which:

FIG. 9 is a cross sectional view of an organic electroluminescence display device according to a third embodiment of the invention.

DETAILED DESCRIPTION OF CERTAIN INVENTIVE EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout.

Figure 1:
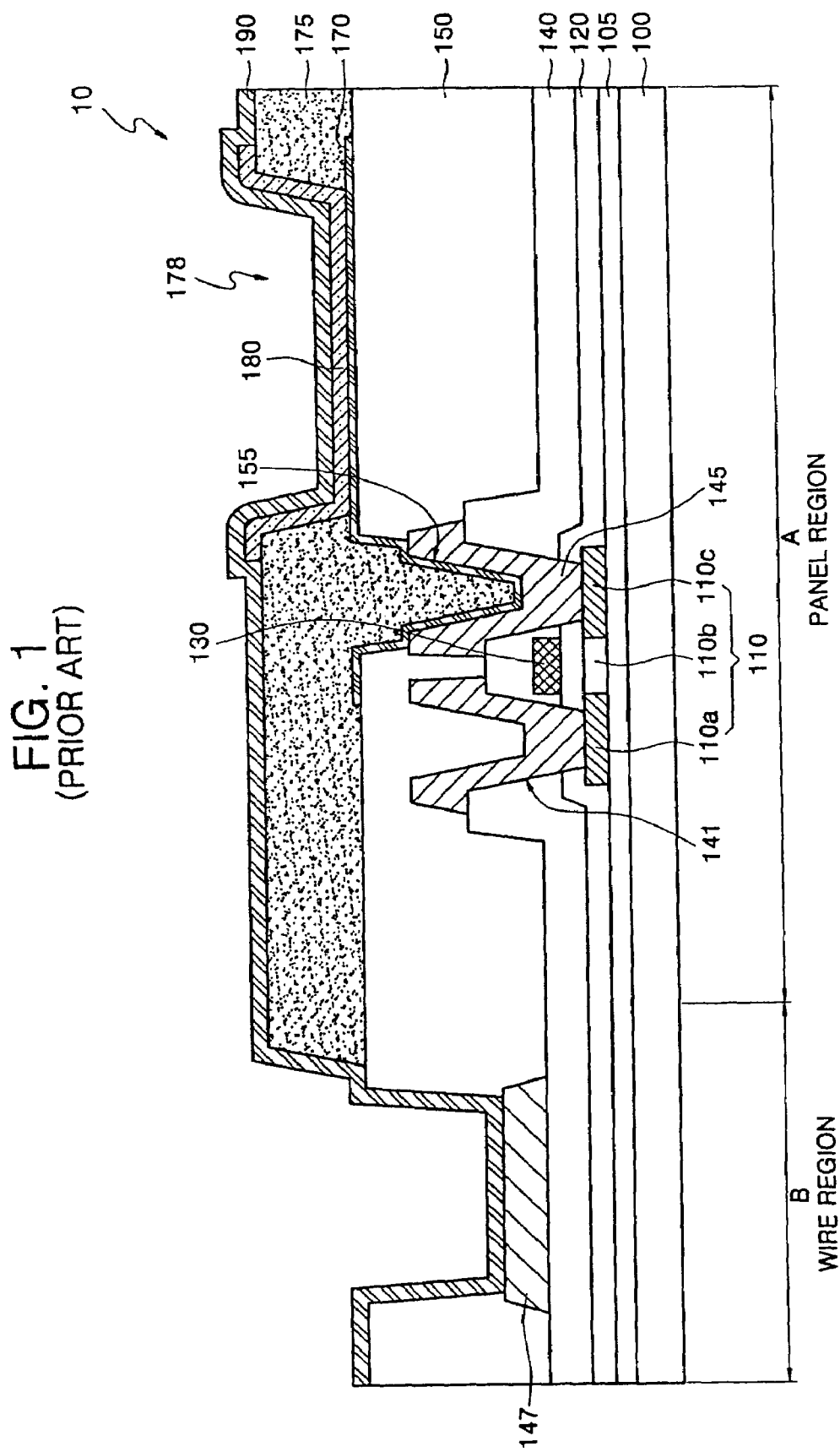
FIG. 1 is a cross sectional view of an exemplary active matrix type organic electroluminescence display device.
Figure 2:
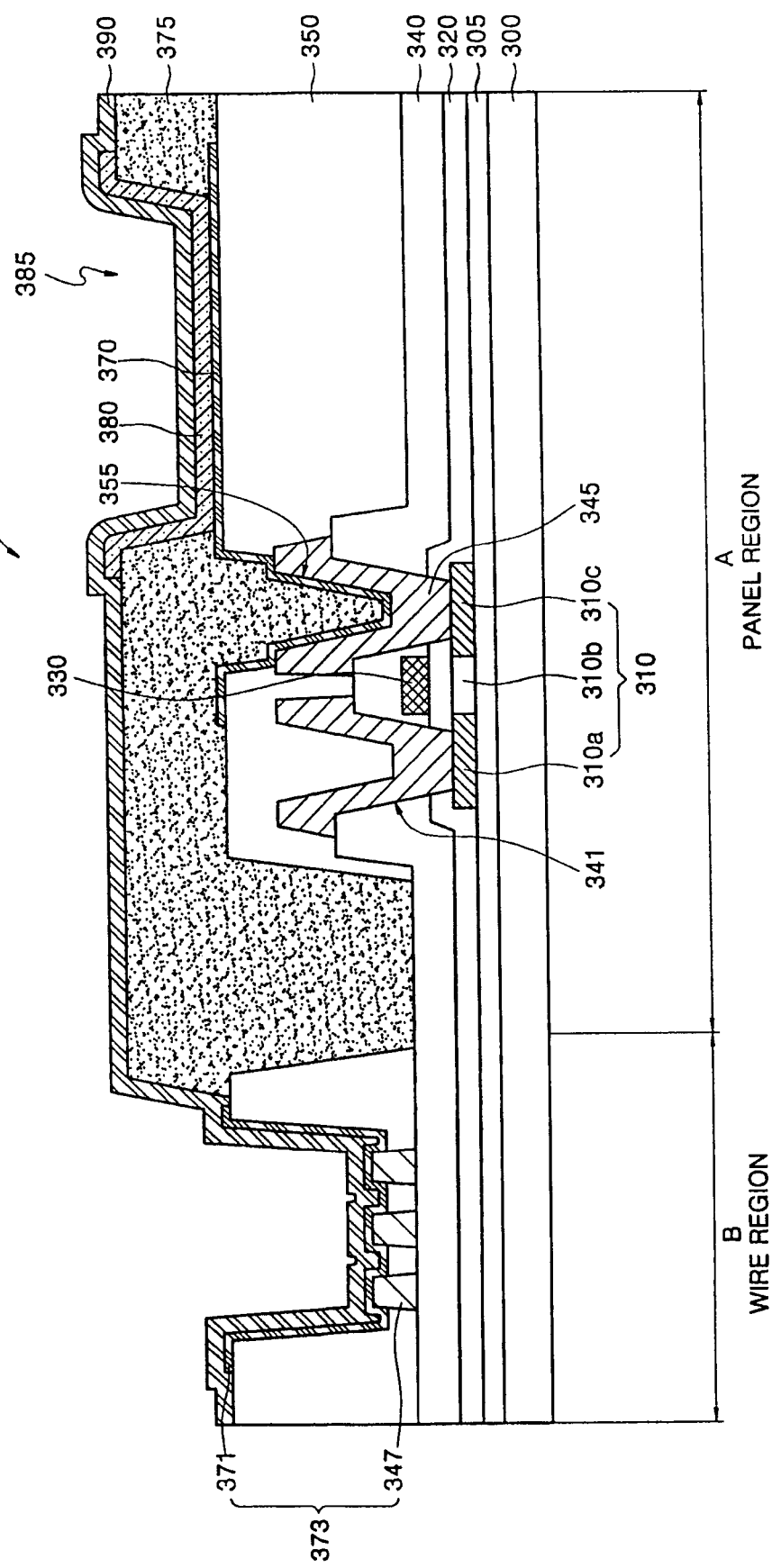
FIG. 2 is a cross sectional view of an organic electroluminescence display device according to a first embodiment of the invention.

FIG. 2 is a cross sectional view of an organic electroluminescence display device 200 according to a first embodiment of the invention. Referring to FIG. 2, the organic electroluminescence display device 200 comprises a substrate 300 having panel and wire regions A and B, and a buffer layer 305 disposed on substantially the entire surface of the substrate 300. The buffer layer 305 may comprise a silicon nitride layer, a silicon oxide layer, or a double layer thereof. A semiconductor layer 310 having source/drain regions 310c and 310a and a channel region 310b is disposed on the buffer layer 305 in the panel region A. In one embodiment, the source/drain regions 310c and 310a and the channel region 310b of the semiconductor layer 310 are formed by patterning a polysilicon or amorphous silicon layer disposed on the buffer layer 305. Preferably, the semiconductor layer 310 is formed using polysilicon.

A gate insulating layer 320 is disposed over substantially the entire surface of the substrate including the semiconductor layer 310. The gate insulating layer 320 may be formed as a silicon nitride layer, a silicon oxide layer, or a double layer thereof, for example.

A gate electrode 330 is disposed on the gate insulating layer 320 in an area corresponding to the channel region 310b of the semiconductor layer 310. The gate electrode may be formed by depositing a gate metal material on the gate insulating layer 320 in the panel region A and patterning the gate metal material. Following formation of the gate electrode 330, the source/drain regions 310c and 310a and channel region 310b are defined by implanting n-type or p-type ion impurities into the semiconductor layer 310 using a mask.

An interlayer insulating layer 340 is formed over substantially the entire surface of the substrate including the gate electrode 330, wherein the interlayer insulating layer may comprise a silicon oxide layer, a silicon nitride layer, or a double layer thereof. Subsequently, a contact hole 341 is formed in the interlayer insulating layer 340 in the panel region A to expose the source/drain regions 310c and 310a.

Source/drain electrodes 345 are formed in the panel region A so as to contact the source/drain regions 310c and 310a of semiconductor layer 310 through the contact hole 341. In one embodiment, the source/drain electrodes 345 are formed by depositing and patterning a metal material on the interlayer insulating layer 340. Accordingly, the semiconductor layer 310, the gate electrode 330, and the source/drain electrodes 345 constitute a thin film transistor.

The display device 200 further comprises a plurality of first conductive patterns 347, having a concave-convex structure, which are formed in the wire region B by performing a lithography process on the metal material. In one embodiment, the first conductive patterns 347 comprise the same material as that of the source/drain electrodes 345. The source/drain electrodes 345 comprise at least one of molybdenum (Mo), tungsten (W), tungsten molybdenum (MoW), tungsten silicide ($WSi_2$), molybdenum silicide ($MoSi_2$), and aluminum (Al). During the formation of the first conductive patterns 347, voltage supply lines Vdd and data lines Vdata are simultaneously formed.

An insulating layer 350 is formed on the thin film transistor in the panel region A and on the first conductive patterns 347 in the wire region B. In one embodiment, the insulating layer 350 includes a passivation layer and/or a planarization layer. The passivation layer preferably protects the thin film transistor against contamination and may comprise a silicon nitride layer, a silicon oxide layer, or a double layer thereof. The planarization layer may comprise at least one of acrylic resin, benzo cyclo butane (BCB) resin, polyimide (PI) resin, polyamide (PA) resin, and phenol resin. The insulating layer 350 is subjected to a curing process.

The first conductive patterns 347 are formed so as to have a line width of about 1 to about 750 µm and a separation distance of about 5 to about 350 µm. If the line width is about 1 µm or less, IR drop may occur at the second electrode. If the line width is about 750 µm or more, reflow of the planarization layer of an organic layer may not be effectively performed during an organic layer curing process. As a result of a poor reflow process, the organic layer may be too thick, which causes out-gassing of the remaining gases in the organic layer into an organic electroluminescent layer.

To avoid this out-gassing phenomenon, the spacing between the conductive patterns 347 is preferably maintained at about 5 µm or more and minimized within a tolerance range of a current organic EL manufacturing apparatus. The spacing is also preferably about 350 µm or less so as not to lead to IR drop, wherein the first conductive patterns 347 form a portion of an auxiliary electrode line of the display device 200.

With the exception of a predetermined region, the insulating layer in the panel region A is isolated using a photolithography process and an etch process. Specifically, the insulating layer 350 in the wire region B is subject to a lithography process to expose at least upper portions of the first conductive patterns 347. The insulating layer is removed from the panel region A and the upper portions of the first conductive patterns 347, so that, after the deposition of the organic layer 380 in the following process, the out-gassing of remaining gases into an organic electroluminescent layer can be prevented.

A via hole 355 is formed in the insulating layer 350 in the panel region A to expose one of the source/drain electrodes 345. Next, a first electrode 370 is formed in contact with one of the source/drain electrodes 345 through the via hole 355. Where the first electrode 370 is configured as an anode electrode, the first electrode 370 may be a transparent electrode made of a high-work-function conductive transparent material, such as Indium Tin Oxide (ITO) or Indium Zinc Oxide (IZO), or a transparent electrode having a reflective layer (made of a highly-reflective metal such as aluminum and aluminum alloy) as an underlying layer. Where the first electrode 370 is configured as a cathode electrode, the first electrode 370 may be a thin or thick reflective electrode comprising one or more materials selected from a group of low-work-function conductive metals such as Mg, Ca, Al, and alloys thereof.

During the formation of the first electrode 370, auxiliary electrode lines 373 are formed on the first conductive patterns 347 in the wire region B by forming a plurality of the second conductive patterns 371. In one embodiment, the second conductive patterns 371 comprise the same material as that of the first electrode 370 and are configured to electrically connect the first conductive patterns 347 to each other. The second conductive patterns 371 prevent damage to the wire by avoiding exposure of the first conductive patterns 347 in the wire region B to an etchant or a developer used in a patterning process for the first electrode 370 in the panel region A.

An organic material is deposited on the first electrode 370 in the panel region A. In addition, a pixel defining layer 375 including an opening may be further formed by using a lithography process. The pixel defining layer 375 may comprise one or more organic materials, such as acrylic resin, benzo cyclo butane (BCB) resin, polyimide (Pi) resin, polyamide (PA) resin, and phenol resin.

An organic layer 380, including at least an organic electroluminescent layer, is formed on the first electrode 370 exposed by an opening 385 in the panel region A. In addition to the organic electroluminescent layer, the organic layer 380 may include at least one of a hole injecting layer, a hole transport layer, an electron transport layer, and an electron injecting layer.

A second electrode 390 is formed over substantially the entire surface of the substrate including the organic layer 380. Where the first electrode 370 is configured as an anode electrode (a transparent electrode or a transparent electrode having a reflective layer as an underlying layer), the second electrode 390 is formed as a reflective electrode comprising one or more low-work-function conductive metals, such as Mg, Ca, Al, and alloys thereof. Where the first electrode 370 is configured as a cathode electrode, the second electrode 390 is formed as a transparent electrode made of ITO or IZO.

The first conductive patterns 347 form a portion of an auxiliary electrode line. Because the materials of the first conductive patterns 347, e.g., molybdenum (Mo) and tungsten (W), have a higher heat capacity than a silicon nitride (SiNx) layer of the insulating layer (350), the first conductive patterns 347 may not effectively transfer heat to the silicon nitride (SiNx) layer. However, the plurality of first conductive patterns 347 and the plurality of second conductive patterns 371 reduce the contact area between the second electrode 390 and the silicon nitride layer, thereby lowering heat resistance and optimizing heat transfer during the curing process for the organic layers. The improved heat transfer provides for more effective reflow in each of the wire regions during organic layer curing, resulting in better uniformity of the cured organic layers between the regions. The uniformity of the organic layers preferably includes uniformity of thicknesses between the regions. Accordingly, an organic layer having a uniform thickness with a small step difference can be formed. In addition, the remaining gasses are removed from the organic layers, thereby preventing out-gassing of the remaining gases from an organic layer into the organic electroluminescent layer, and avoiding pixel shrinkage caused by deterioration of the organic electroluminescent layer.

One embodiment of a method of manufacturing the organic electroluminescence display device 200 comprises preparing a substrate 300 made of glass, quartz, or plastic. Next, the buffer layer 305 is formed on the substrate 300. The buffer layer 305 may comprise a silicon nitride layer, a silicon oxide layer, or a double layer thereof.

Formation of the buffer layer 305 may comprise a plasma-enhanced chemical vapor deposition (PECVD) process, or a low-pressure chemical vapor deposition (LPCVD) process, for example. The method further comprises forming the semiconductor layer 310 having source/drain regions 310c and 310a and a channel region 310b on the buffer layer 305 in the panel region A.

Forming the semiconductor layer 310 may comprise depositing an amorphous silicon with a chemical vapor deposition (CVD) process, crystallizing the deposited amorphous silicon into a crystalline polysilicon layer with a crystallization process, and patterning the resulting layer. The CVD process may include the PECVD and LPCVD processes. Where the amorphous silicon is deposited using the PECVD process, after the silicon layer is deposited, a thermal dehydrogenation process may be performed in order to reduce concentration of hydrogen in the silicon layer.

The crystallization process for the amorphous silicon layer may comprise one of a rapid thermal annealing (RTA) process, a metal induced crystallization (MIC) process, a metal induced lateral crystallization (MILC) process, a solid phase crystallization (SPC) process, an excimer laser annealing (ELA) process, and a sequential lateral solidification (SLS) process.

The method further comprises forming the gate insulating layer 320 over substantially the entire surface of the substrate including the semiconductor layer 310. Formation of the gate insulating layer 320 may comprise deposition using a PECVD process, or a LPCVD process, for example.

The method also comprises forming the gate electrode 330, corresponding to the channel region 310b of the semiconductor layer 310. Formation of the gate electrode 330 may comprise depositing a gate metal material on the gate insulating layer 320 in the panel region A and patterning the gate metal material. Where the gate electrode 330 is formed as a polysilicon layer, the gate electrode 330 is formed with an amorphous silicon using the same process as was used to form the semiconductor layer 310. Where the gate electrode 330 is formed using one of molybdenum (Mo), tungsten (W), tungsten molybdenum (MoW), tungsten silicide (WSi$_2$), and molybdenum silicide (MoSi$_2$), forming the gate electrode 330 comprises a LPCVD or PECVD process and a patterning process.

The method of manufacturing the display device 200 further comprises forming source/drain regions 310c, 310a and channel region 310b, comprising implanting impurities into the semiconductor layer 310 using a mask. The impurities may be one of n-type and p-type impurities. The n-type impurity may comprise at least one of phosphorus (P), arsenic (As), and antimony (Sb), for example, and the p-type impurity may comprise at least one of boron (B), gallium (Ga), indium (In), for example.

The method further comprises forming an interlayer insulating layer 340 on the gate electrode 330 over substantially the entire surface of the substrate including the gate electrode 330. Formation of the interlayer insulating layer 340 may comprise a PECVD process, or an LPCVD process, for example.

The method also comprises forming a contact hole 341 in the interlayer insulating layer 340 in the panel region A so as to expose the source/drain regions 310c and 310a of the semiconductor layer 310. Following formation of the contact hole 341, source/drain electrodes 345 are formed in the panel region A in contact with the source/drain regions 310c and 310a of semiconductor layer 310 through the contact hole 341. Formation of the source/drain electrodes 345 may comprise depositing a metal material on the interlayer insulating layer 340 and patterning the metal material. The method further comprises forming a plurality of first conductive patterns 347 in the wire region B, comprising performing a lithography process on the metal material. In one embodiment, the first conductive patterns 347 comprise the same material as the source/drain electrodes 345. In one embodiment, the source/drain electrodes 345 comprise at least one of molybdenum (Mo), tungsten (W), tungsten molybdenum (MoW), tungsten silicide ($WSi_2$), molybdenum silicide ($MoSi_2$), and aluminum (Al).

The plurality of the first conductive patterns 347 are preferably formed to have a line width of about 1 to about 750 µm and a spacing of about 5 to about 350 µm.

The semiconductor layer 310, the gate electrode 330, and the source/drain electrodes 345 constitute a thin film transistor, and the method of manufacturing the display device 200 further comprises forming the insulating layer 350 on the thin film transistor in the panel region A and on the first conductive patterns 347 in the wire region B. The insulating layer 350 may comprise a passivation layer and/or a planarization layer. Formation of the passivation layer may comprise forming a silicon nitride layer, a silicon oxide layer, or a double layer thereof. The planarization layer may comprise one or more organic materials, such as acrylic resin, benzo cyclo butane (BCB) resin, polyimide (PI) resin, polyamide (PA) resin, and phenol resin. After the planarization layer is deposited using a spin coating process, the insulating layer 350 is subject to a curing process.

With the exception of predetermined regions in the panel and wire regions A and B, the insulating layer in the panel region A is isolated in a photo-lithography process and an etch process. At this time, the insulating layer 350 in the wire region B is subject to a lithography process to expose at least upper portions of the first conductive patterns 347. The insulating layer is removed from the panel region A and the upper portions of the first conductive patterns 347. Thereby, after the deposition of the organic layer, the out-gassing of remaining gases into the organic electroluminescent layer can be prevented. As a result, pixel shrinkage caused by deterioration of the organic electroluminescent layer can be prevented.

Figure 3:
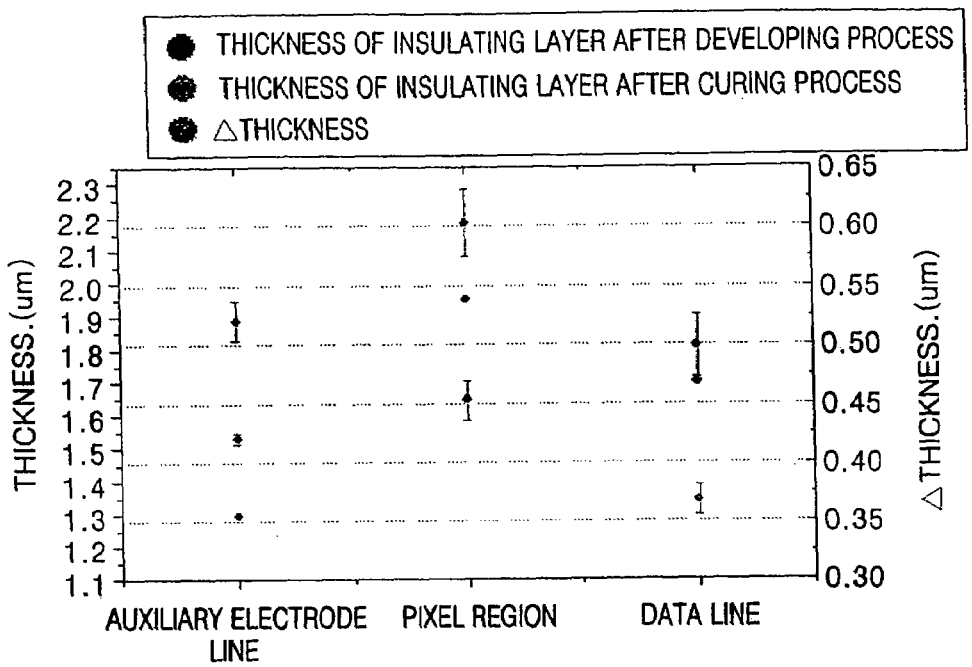
FIG. 3 is a graphical illustration of thicknesses of insulating layers after a curing process with respect to layers of the organic electroluminescence display device.

FIG. 3 is a graphical illustration showing thicknesses of insulating layers after the curing process with respect to layers of the organic electroluminescence display device. Referring to FIG. 3, after an auxiliary electrode line, a pixel region, and data lines are subjected to a developing process, the thicknesses of the insulating layers thereof increase in the ascending order of the pixel region, the auxiliary electrode line, and the data lines. However, after the developed layer is subjected to the curing process, the thicknesses of the insulating layers indicate that the curing effects thereof decrease in the descending order of the pixel region, data lines, and the auxiliary electrode line, and the auxiliary electrode line is not effectively cured.

Figure 4:
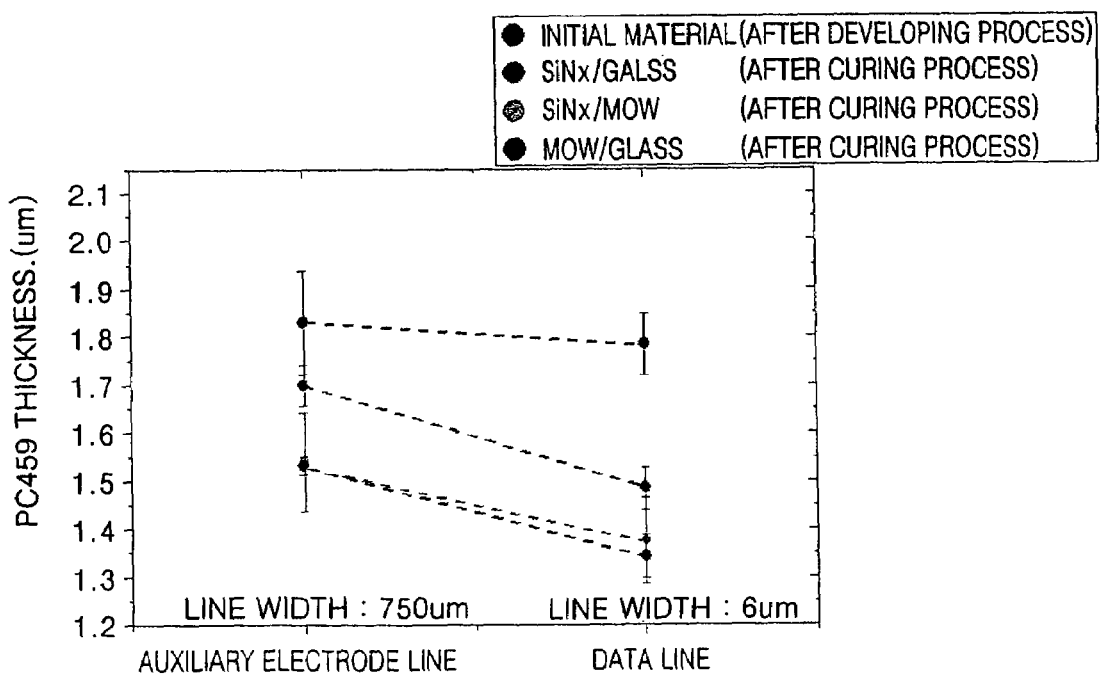
FIG. 4 is a graphical illustration of thicknesses of insulating layers after a curing process with respect to materials and line widths of the auxiliary electrode line and data lines.

FIG. 4 is a graphical illustration showing thicknesses of insulating layers after the curing process with respect to materials and line widths of the auxiliary electrode line and data lines. Referring to FIG. 4, a comparison of the first conductive pattern of the auxiliary electrode line having a line width of 750 µm and the data line having a line width of 6 µm indicates that, because the thicknesses of the organic layers (PC459) of the auxiliary electrode line and the data lines after the developing process are 1.80 to 1.85 µm, respectively, the thicknesses thereof do not have a significant difference.

However, where silicon nitride (SiNx) layer/glass is cured, the thickness of the insulating layer of the first conductive pattern of the auxiliary electrode line having a line width of 750 µm decreases by 0.13 µm, and the thickness of the insulating layer of the data line having a line width of 6 µm decreases by 0.3 µm. Where silicon nitride (SiNx) layer/ tungsten molybdenum (MoW) is cured, the thickness of the insulating layer of the first conductive pattern of the auxiliary electrode line having a line width of 750 µm decreases by 0.16 µm, and the thickness of the insulating layer of the data line having a line width of 6 µm decreases by 0.1 µm. Where tungsten molybdenum (MoW)/glass is cured, the thickness of the insulating layer of the first conductive pattern of the auxiliary electrode line having a line width of 750 µm does not decrease, and the thickness of the insulating layer of the data line having a line width of 6 µm decreases by 0.05 µm. Thus, the effect of the curing process can be improved by reducing the line width of the first conductive pattern of the auxiliary electrode line and performing the curing process.

Figure 5:
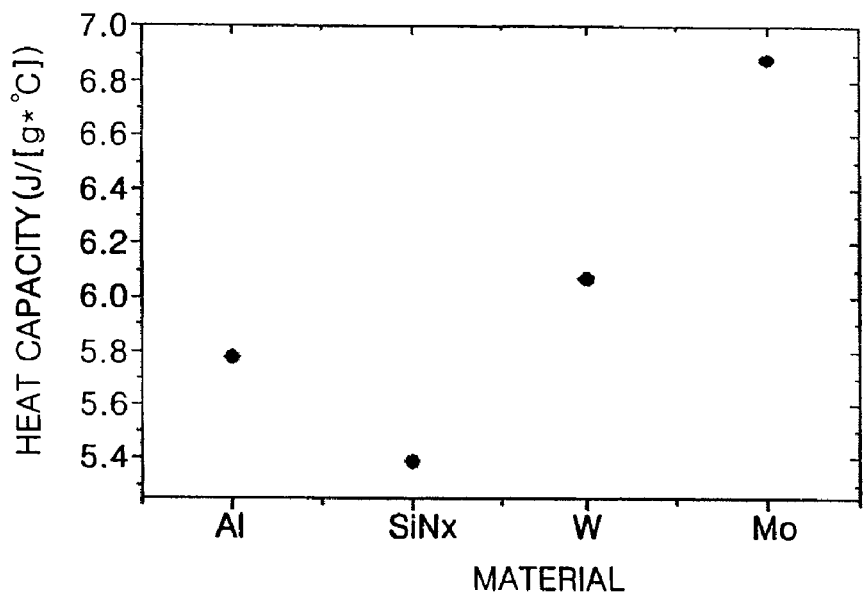
FIG. 5 is a graphical illustration of characteristic values of physical properties of a first conductive pattern according to one embodiment of the invention.
Figure 6:
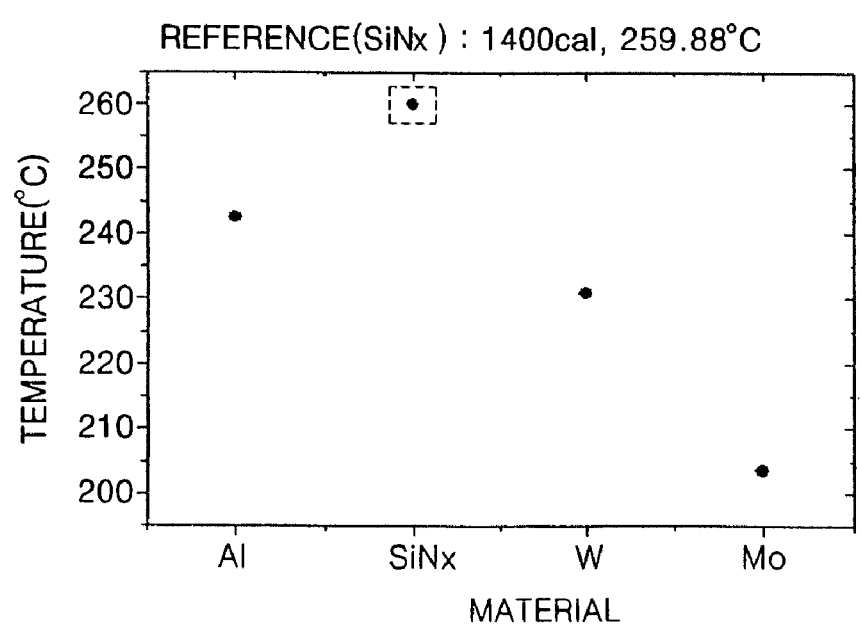
FIG. 6 is a graphical illustration of a heat capacity, one of physical properties, of the first conductive pattern with respect to a temperature thereof.

Table 1 and FIG. 5 illustrate the characteristic values of physical properties of the first conductive pattern materials, and Table 2 and FIG. 6 illustrate a heat capacity and the physical property of the first conductive pattern with respect to a temperature thereof.

TABLE 1

| Physical Properties | Mass (g) | Specific Heat (cal/[g * ° C.]) | Heat Capacity (cal/° C.) | Thermal Conductivity (cal/cm * s) |
|---|---|---|---|---|
| Al | 26.982 | 0.214 | 5.774 | 0.55 |
| SiNx | 32.064 | 0.168 | 5.387 | 0.36 |
| W | 183.85 | 0.033 | 6.067 | 0.35 |
| Mo | 95.54 | 0.072 | 6.879 | 0.33 |

TABLE 2

| | 260° C. reference | | |
|---|---|---|---|
| Physical Property | Q = 1,778.54 cal (Mo) | Q = 1,400 cal (Si) | ° C. = 260 |
| Al | 309.75° C. | 242.46° C. | 1,501 cal |
| SiNx | 330.15° C. | 259.88° C. | 1,400 cal |
| W | 293.14° C. | 230.75° C. | 1,577 cal |
| Mo | 260.00° C. | 203.51° C. | 1,788 cal |

Referring to Table 1 and FIG. 5, the thermal conductivities of the silicon nitride (SiNx) layer, the tungsten (W), and the molybdenum (Mo) do not have a significant difference, but the thermal conductivity of the aluminum (Al) is higher by about 0.2 cal/cm*s than those of the silicon nitride (SiNx) layer, tungsten (W), and the molybdenum (Mo). However, the heat capacities of the tungsten (W) and the molybdenum (Mo) are higher than those of the aluminum (Al) and the silicon nitride (SiNx) layer.

Referring to Table 2, where 1400 cal is applied and the material is at 260° C., the heat capacities of the molybdenum (Mo), the tungsten (W), and the aluminum (Al) are higher than that of the silicon nitride (SiNx) layer. As illustrated in FIG. 6, the temperatures for the molybdenum (Mo), the tungsten (W), and the aluminum (Al) are lower than that of the silicon nitride (SiNx) layer in response to 1400 cal. Therefore, the molybdenum (Mo), the tungsten (W), and the aluminum (Al) cannot effectively transfer heat to the silicon nitride (SiNx) layer due to the difference between the heat capacities. Thus, reflow is not effective during the curing process for the organic layers. Accordingly, it is preferable that the first conductive patterns 347 are formed to have a concave-convex structure. In certain embodiments, the plurality of first conductive patterns 347 have a line width of about 1 to about 750 μm and a spacing of about 5 to about 350 μm in order to maximize the effect of reflow during the organic layer curing process.

Referring again to the method of manufacturing the display device 200, voltage supply lines Vdd and data lines Vdata are simultaneously formed during the formation of the first conductive patterns 347. The method further comprises forming a via hole 355 in the insulating layer 350 in the panel region A so as to expose one of the source/drain electrodes 345.

Following formation of the via hole 355, a first electrode 370 is formed in contact with one of the exposed source/drain electrodes 345 through the via hole 355 and extending to the insulating layer 350. Formation of the first electrode 370 may comprise a sputtering process, or an ion plating process, for example. Preferably, formation of the first electrode 370 comprises a general sputtering process. After the first electrode 370 is deposited, the first electrode 370 is patterned using an etching process employing a pattern of a photoresist (PR) layer formed by a photo-lithography process.

After patterning the first electrode 370, the auxiliary electrode lines 373 are formed on the first conductive patterns 347 in the wire region B by forming a plurality of the second conductive patterns 371. In one embodiment, the second conductive patterns 371 comprise the same material as that of the first electrode 370 and are configured to electrically connect the first conductive patterns 347. The structure of the second conductive patterns 371 is also configured to reduce the contact area thereof to the second electrode 390, thereby reducing heat resistance and optimizing heat transfer. In addition, the second conductive patterns 371 prevent damage to the wire by avoiding exposure of the first conductive patterns 347 in the wire region B to an etchant or a developer during a patterning process for the first electrode 370 in the panel region A.

Next, an organic material is deposited on the first electrode 370 in the panel region A, and a pixel defining layer 375 may be further formed using an etching process. In one embodiment, the pixel defining layer 375 comprises one or more organic materials, such as acrylic resin, benzo cyclo butane (BCB) resin, polyimide (Pi) resin, polyamide (PA) resin, and phenol resin. In one embodiment, deposition of the pixel defining layer 375 comprises a spin coating process.

The method of manufacturing the display device 200 further comprises, after deposition of the pixel defining layer 375, depositing an organic layer 380, comprising at least an organic electroluminescent layer, on the first electrode 370 exposed by the opening 385 in the panel region A. Deposition of the organic layer 380 may comprise a vacuum deposition process, a spin coating process, or a laser induced thermal imaging (LITI) process, for example. Preferably, the organic layer 380 is deposited using the spin coating process. In addition, patterning of the organic layer 380 may comprise the LITI process or the vacuum deposition process using a shadow mask.

The organic electroluminescent layer may comprise a small-molecule material or a polymer material. The small-molecule material may be one or more of aluminum-quinolinol complex (Alq3), anthracene, cyclo pentadiene, BeBq2, Almq, ZnPBO, Balq, DPVBi, BSA-2, and 2PSP. The polymer material may be one or more of polyphenylene (PPP), derivatives thereof, poly(p-phenylenevinylene) (PPV), derivatives thereof, polythiophene (PT), and derivatives thereof.

Following formation of the organic layer 380, the method proceeds to a process in which a second electrode 390 is formed on the organic layer 380 over substantially the entire surface of the substrate. Formation of the second electrode 390 may comprise a vacuum deposition process.

The method of manufacturing the organic electroluminescence display device further comprises hermetically sealing the substrate 300 and an upper substrate. Thereby manufacturing of the organic electroluminescence display device is completed.

Figure 7:
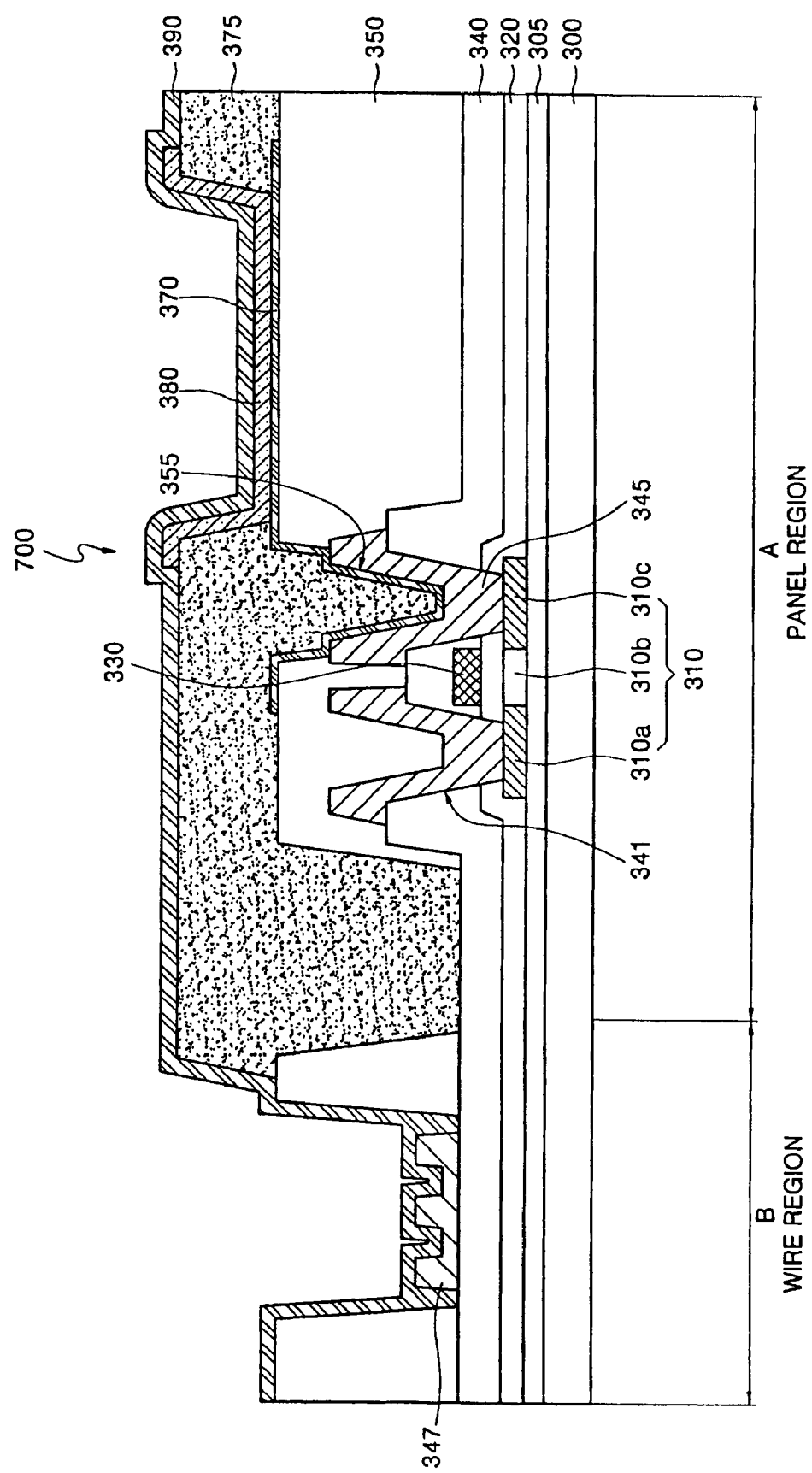
FIG. 7 is a cross sectional view of an organic electroluminescence display device according to a second embodiment of the invention.

FIG. 7 is a cross sectional view of an organic electroluminescence display device 700 according to a second embodiment of the invention. Referring to FIG. 7, the organic electroluminescence display device 700 is formed with the same construction as that of the organic electroluminescence display device 200 until the interlayer insulating layer 340 is formed on the substrate 300.

After formation of the interlay insulating layer 340, source/drain electrodes 345 are formed in contact with the source/drain regions 310c and 310a of the semiconductor layer 310 through the contact hole 341 in the panel region A. Formation of the source/drain electrodes 345 may comprise depositing a metal material on the interlayer insulating layer 340 and patterning the metal material. A first conductive pattern 347 having trenches is formed in the wire region B by performing a lithography process on the metal material of the source/drain electrodes 345. In one embodiment, the first conductive pattern 347 comprises the same material as that of the source/drain electrodes 345. During the formation of the first conductive pattern 347, voltage supply lines Vdd and data lines Vdata are simultaneously formed.

Unlike the plurality of the first conductive patterns in the display device 200, the first conductive pattern 347 in the display device 700 comprises trenches. In one embodiment, the first conductive pattern 347 has a line width of about 1 to about 750 μm and a spacing of 5 to 350 μm.

Because the line width is reduced by the first conductive pattern 347 having trenches as compared to the first conductive pattern 147 of the display device 10, the reflow is more effectively performed during a curing process for the organic layer of the display device.

Following formation of the first conductive pattern 347, an insulating layer 350 is formed on the thin film transistor in the panel region A and on the first conductive pattern 347. The insulating layer 350 comprises a passivation layer and/or a planarization layer, and insulating layer 350 is subjected to a curing process. To the exclusion of a predetermined minimal region, the insulating layer 350 in the panel region A is subject to a photo-lithography process and an isolated etch process. Following the etch process, the insulating layer 350 formed on the first conductive pattern 347 in the wire region B is removed using a lithography process. Specifically, the insulating layer 350 is removed from the upper portion of the first conductive pattern 347 so as to prevent, after the deposition of the organic layer in the following process, out-gassing of remaining gases into the organic electroluminescent layer Following the selective removal of the insulating layer 350, a via hole 355 is formed in the insulating layer 350 in the panel region A to expose one of the source/drain electrodes 345. A first electrode 370 is then formed in contact with one of the source/drain electrodes 345 through the via hole 355 and extends to the insulating layer 350.

Next, an organic material is deposited on the first electrode 370 in the panel region A, and a pixel defining layer 375 may be further formed by using an etching process. Following formation of the pixel defining layer 375, an organic layer 380, comprising at least an organic electroluminescent layer, is formed on the first electrode 370 exposed by an opening 385 in the panel region A.

A second electrode 390 is formed on the organic layer 380 over substantially the entire surface of the substrate. The first conductive pattern 347 in the wire region B is directly in contact with and electrically connected to the second electrode 390, so as to implement an auxiliary electrode line 373 similar to that of auxiliary electrode line of the display device 200.

Figure 8:
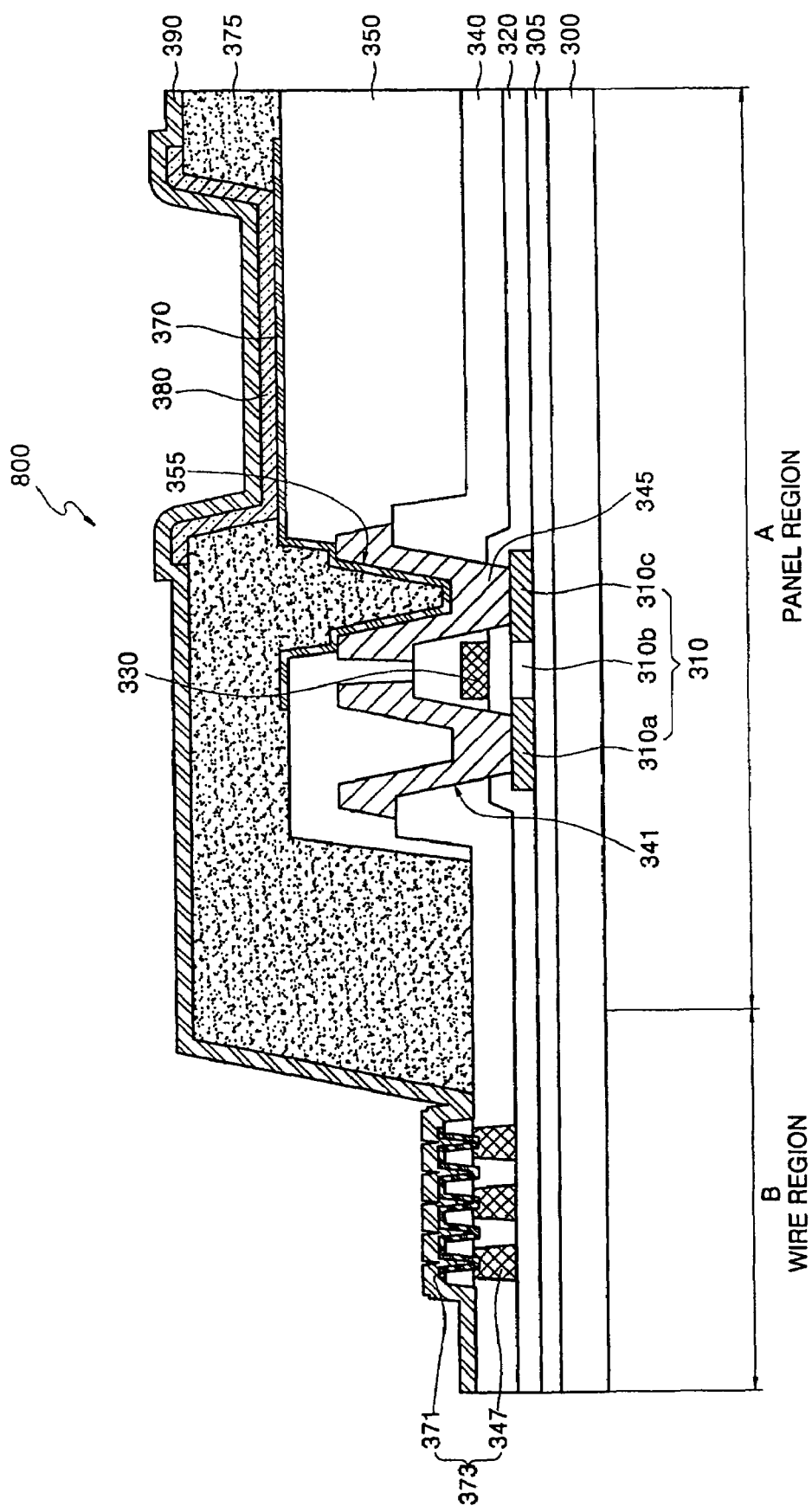
FIG. 8 is a cross sectional view of an organic electroluminescence display device according to a third embodiment of the invention.

FIG. 8 is a cross sectional view of a third embodiment of an organic electroluminescence display device 800. The organic electroluminescence display device 800 is formed with the same construction as those of the organic electroluminescence display devices 200, 700 until the gate insulating layer 320 is formed on the substrate 300.

In reference to FIG. 8, a gate electrode 330 is formed on the gate insulating layer 320 in the panel region A. Following formation of the gate electrode 330, a plurality of first conductive patterns 347, comprising the same material as that of the gate electrode 330, are formed on the wire region B of the gate insulating layer 320. The first conductive patterns 347 may be formed using the same process as that of the first embodiment.

The line width of the auxiliary electrode is reduced by the plurality of first conductive patterns 347 in the display device 800, and thereby the reflow is effectively performed during a curing process for an organic layer of the display device.

During the formation of the first conductive patterns 347, voltage supply lines Vdd and data lines Vdata are simultaneously formed. Subsequently, an interlayer insulating layer 340 is formed on the gate electrode 330 and the first conductive patterns 347. The structures of the source/drain electrodes 345 formed on the interlayer insulating layer 340 are the same as those of the first and second embodiments 200, 700.

Following formation of the source/drain electrodes 345, an insulating layer 350 is formed on the thin film transistor in the panel region A and on the first conductive patterns 347 in the wire region B. Next, the insulating layer 350 is subjected to a curing process. To the exclusion of a predetermined minimal region, the insulating layer in the panel region A is subjected to a photo-lithography process and an etch process to isolate the insulating layer 350.

The insulating layer 350 formed on the first conductive patterns 347 in the wire region B is removed using a lithography process to the exclusion of a portion of the first conductive patterns 347. Specifically, the insulating layer 350 is removed from the upper portions of the first conductive patterns 347 so as to prevent, after the deposition of the organic layer 380, out-gassing of remaining gases into the organic electroluminescent layer. As a result, a pixel shrinkage phenomenon resulting from deterioration of the organic electroluminescent layer is prevented.

The processes for forming the additional components of the display device 800, including the first electrode 370 and the second electrode 390, are the same as those of the first embodiment of the display device 200.

FIG. 9 is a cross sectional view of a fourth embodiment of an organic electroluminescence display device 900. The display device 900 is formed with the same construction as those of the organic electroluminescence display devices according to the first to third embodiments until the gate insulating layer 320 is formed on the substrate 300.

Referring to FIG. 9, the gate electrode 330 is formed on the gate insulating layer 320 in the panel region A using a patterning process. A first conductive pattern 347 is formed on the gate insulating layer 320 and comprises trenches. In the display device 900, the first conductive pattern 347 comprises the same material as that of the gate electrode 330. The first conductive pattern 347 of the display device 900 is formed using the same process as that of the second embodiment, display device 200.

The first conductive pattern 347 is formed with a line width of about 1 to about 750 μm and a spacing of about 5 to about 350 μm. The structure of the first conductive pattern 347 provides for reduction in the line width, thereby allowing for effective reflow during the curing process for the organic layer of the display device 900.

During the formation of the first conductive pattern 347, voltage supply lines Vdd and data lines Vdata are simultaneously formed. Subsequently, an interlayer insulating layer 340 is formed on the gate electrode 330 and the first conductive patterns 347.

The structures of the source/drain electrodes 345 and the insulating layer 350 formed on the interlayer insulating layer 340 are the same as those of the third embodiment of the display device 800. Following formation of the insulating layer 350, a first electrode 370 is formed in contact with one of the source/drain electrodes 345 through the via hole 355 in the insulating layer 350 in the panel region A, wherein the first electrode 370 extends to the insulating layer 350.

The processes for forming subsequent structures in the display device 900, including the pixel defining layer 375 on the first electrode 370 to the second electrode 390 are the same as those of the second embodiment.

Although the organic electroluminescence display device embodiments described above include a top-gate type thin film transistor, the invention is not limited thereto, and organic electroluminescence display devices having a bottom-gate type thin film transistors are within the scope of the invention.

As discussed above, embodiments of the invention prevent IR drop of a second electrode by forming an auxiliary electrode line in an organic electroluminescence display device. In addition, where a plurality of patterns and/or trenches are provided in the auxiliary electrode line to reduce a contact area between the auxiliary electrode line and the second electrode, heat resistance is lowered to optimize the heat transfer during an organic layer curing process. In addition, remaining gases in an organic layer can be removed due to the configuration of the auxiliary electrode, thereby preventing pixel shrinkage caused by deterioration of an organic electroluminescent layer due to out-gassing of remaining gases into the organic electroluminescent layer. Accordingly, the reliability of the display device is improved with the embodiments of the invention described above.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. An organic electroluminescence display device, comprising:
a substrate having a panel region and a wire region;
a particular thin film transistor formed on the substrate in the panel region, wherein the thin film transistor comprises a semiconductor layer, a gate electrode, and source/drain electrodes;
a plurality of first conductive patterns formed on the substrate in the wire region adjacent to the particular thin film transistor, wherein the plurality of first conductive patterns have separations therebetween;
an insulating layer formed on the first conductive patterns so as to expose each of the first conductive patterns;
a first electrode in contact with one of the source/drain electrodes through a via hole formed in the insulating layer;
a plurality of second conductive patterns formed directly on the first conductive patterns in the wire region, wherein the second conductive patterns contact each of the first conductive patterns;
an organic layer formed on the first electrode in the panel region, wherein the organic layer comprises at least an organic electroluminescent layer; and
a second electrode formed on the organic layer over substantially the entire surface of the substrate and formed directly on the plurality of second conductive patterns.

2. The organic electroluminescence display device according to claim 1, wherein the first conductive patterns comprise the same material as those of the source/drain electrodes.

3. The organic electroluminescence display device according to claim 2, wherein the source/drain electrodes comprise at least one of molybdenum (Mo), tungsten (W), tungsten molybdenum (MoW), aluminum (Al), and tungsten silicide ($WSi_2$).

4. The organic electroluminescence display device according to claim 1, wherein the first conductive patterns have a line width of about 1 to about 750 μm and a spacing of about 5 to about 350 μm.

5. The organic electroluminescence display device according to claim 1, wherein the second conductive patterns comprise the same material as the first electrode.

6. An organic electroluminescence display device, comprising:
a substrate having a panel region and a wire region;
a particular thin film transistor formed in the panel region of the substrate, wherein the thin film transistor comprises a semiconductor layer, a gate electrode, and source/drain electrodes;
a plurality of first conductive patterns formed in the wire region of the substrate and comprising a trench, wherein the plurality of first conductive patterns have separations therebetween and are formed adjacent to the particular thin film transistor;
an insulating layer formed on the first conductive pattern so as to expose at least the first conductive patterns;
a first electrode formed in contact with one of the source/drain electrodes through a via hole formed in the insulating layer;
an organic layer formed on the first electrode in the panel region, wherein the organic layer comprises at least an organic electroluminescent layer; and
a second electrode formed on the organic layer over substantially the entire surface of the substrate, wherein the second electrode is formed over and contacts the first conductive patterns.

7. The organic electroluminescence display device according to claim 6, wherein the first conductive pattern comprises the same material as the source/drain electrodes.

8. The organic electroluminescence display device according to claim 7, wherein the source/drain electrodes comprise at least one of molybdenum (Mo), tungsten (W), tungsten molybdenum (MoW), aluminum (Al), and tungsten silicide ($WSi_2$).

9. The organic electroluminescence display device according to claim 6, wherein the first conductive pattern has a line width of about 1 to about 750 μm and a spacing of about 5 to about 350 μm.

10. An organic electroluminescence display device, comprising:
a substrate having a panel region and a wire region;
a particular thin film transistor formed in the panel region of the substrate, wherein the thin film transistor comprises a semiconductor layer, a gate electrode, and source/drain electrodes;
a plurality of first conductive patterns formed in the wire region of the substrate adjacent to the particular thin film transistor, the plurality of first conductive patterns having separations therebetween;
an insulating layer formed so as to expose at least upper portions of each of the first conductive patterns;
a first electrode formed in contact with one of the source/drain electrodes through a via hole formed in the insulating layer;
a plurality of second conductive patterns formed directly on each of the first conductive patterns exposed by the insulating layer of the wire region;
an organic layer formed on the first electrode in the panel region, wherein the organic layer comprises at least an organic electroluminescent layer; and
a second electrode formed on the organic layer over substantially the entire surface of the substrate, wherein the second electrode is formed directly on the second conductive patterns.

11. The organic electroluminescence display device according to claim 10, wherein the first conductive patterns comprise the same material as the gate electrode.

12. The organic electroluminescence display device according to claim 11, wherein the gate electrode comprises at least one of molybdenum (Mo), tungsten (W), tungsten molybdenum (MoW), aluminum (Al), and tungsten silicide ($WSi_2$).

13. The organic electroluminescence display device according to claim 10, wherein the first conductive patterns have a line width of about 1 to about 750 μm and a spacing of about 5 to about 350 μm.

14. An organic electroluminescence display device, comprising:
a substrate having a panel region and a wire region;
a thin film transistor formed in the panel region of the substrate, wherein the thin film transistor comprises a semiconductor layer, a gate electrode, and source/drain electrodes;
a plurality of first conductive patterns formed in the wire region of the substrate and comprising a trench, wherein the plurality of first conductive patterns have separations therebetween and are formed adjacent to the particular thin film transistor;

an interlayer insulating layer formed on the first conductive pattern so as to expose at least an upper portion of the first conductive pattern;

an insulating layer formed on the source/drain electrodes and removed on the upper portion of the first conductive pattern;

a first electrode formed in contact with one of the source/drain electrodes through a via hole formed in the insulating layer;

an organic layer formed on the first electrode, wherein the organic layer comprises at least an organic electroluminescent layer; and a second electrode formed on the organic layer over substantially the entire surface of the substrate, wherein the second electrode is formed over and contacts the first conductive patterns.

15. The organic electroluminescence display device according to claim 14, wherein the first conductive pattern comprises the same material as the gate electrode.

16. The organic electroluminescence display device according to claim 15, wherein the gate electrode comprises at least one of molybdenum (Mo), tungsten (W), tungsten molybdenum (MoW), aluminum (Al), and tungsten silicide (WSi$_2$).

17. The organic electroluminescence display device according to claim 14, wherein the first conductive pattern has a line width of about 1 to about 750 μm and a spacing of about 5 to about 350 μm.

18. A method of manufacturing an organic electroluminescence display device, comprising:

preparing a substrate having a panel region and a wire region;

forming a particular thin film transistor in the panel region of the substrate, wherein the thin film transistor comprises a semiconductor layer, a gate electrode, and source/drain electrodes;

forming simultaneously a plurality of first conductive patterns in the wire region of the substrate when the source/drain electrodes are formed, wherein the plurality of first conductive patterns have separations therebetween and are formed adjacent to the particular thin film transistor;

forming an insulating layer on the first conductive patterns so as to expose at least the first conductive patterns;

forming a first electrode in contact with one of the source/drain electrodes through a via hole formed in the insulating layer;

forming a plurality of second conductive patterns over the first conductive patterns in the wire region, wherein the second conductive patterns contact the first conductive patterns;

forming an organic layer on the first electrode in the panel region, wherein the organic layer comprises at least an organic electroluminescent layer; and forming a second electrode on the organic layer over substantially the entire surface of the substrate.

19. The method according to claim 18, wherein the first conductive patterns comprise the same material as those of the source/drain electrodes.

20. The method according to claim 19, wherein the source/drain electrodes comprise at least one of molybdenum (Mo), tungsten (W), tungsten molybdenum (MoW), aluminum (Al), and tungsten silicide (WSi$_2$).

21. The method according to claim 18, wherein the first conductive patterns have a line width of about 1 to about 750 μm and a spacing of about 5 to about 350 μm.

22. The method according to claim 18, wherein the second conductive patterns comprise the same material as that of the first electrode.

23. The method according to claim 18, wherein at least one of the plurality of the first conductive patterns is a cathode bus line.

24. The method according to claim 18, wherein at least one of the plurality of the first conductive patterns has a trench.

25. A method of manufacturing an organic electroluminescence display device, comprising:

providing a substrate having a panel region and a wire region;

forming a particular thin film transistor in the panel region of the substrate, wherein the thin film transistor comprises a semiconductor layer, a gate electrode, and source/drain electrodes;

forming simultaneously a plurality of first conductive patterns in the wire region of the substrate when the gate electrode is formed, wherein the plurality of first conductive patterns have separations therebetween and are formed adjacent to the particular thin film transistor;

forming an insulating layer so as to expose at least upper portions of each of the first conductive patterns;

forming a first electrode in contact with one of the source/drain electrodes through a via hole formed in the insulating layer;

forming a plurality of second conductive patterns directly on the first conductive patterns to contact each of the first conductive patterns exposed by the insulating layer of the wire region;

forming an organic layer on the first electrode in the panel region, wherein the organic layer comprises at least an organic electroluminescent layer; and forming a second electrode on the organic layer over substantially the entire surface of the substrate, wherein the second electrode is formed directly on and contacts the second conductive patterns.

26. The method according to claim 25, wherein the first conductive patterns comprise the same material as the gate electrode.

27. The method according to claim 26, wherein the gate electrode comprises at least one of molybdenum (Mo), tungsten (W), tungsten molybdenum (MoW), aluminum (Al), and tungsten silicide (WSi$_2$).

28. The method according to claim 25, wherein the first conductive patterns have a line width of about 1 to about 750 μm and a spacing of about 5 to about 350 μm.

29. The method according to claim 25, wherein forming the first conductive patterns comprises simultaneously forming voltage supply lines Vdd and data lines Vdata.

30. The method according to claim 25, wherein at least one of the plurality of the first conductive patterns is a cathode bus line.

31. The method according to claim 25, wherein at least one of the plurality of the first conductive patterns has a trench.

* * * * *